(12) United States Patent
Lundby

(10) Patent No.: US 7,308,636 B2
(45) Date of Patent: Dec. 11, 2007

(54) APPARATUS AND METHOD OF EARLY DECODING IN COMMUNICATION SYSTEMS

(75) Inventor: Stein A. Lundby, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 660 days.

(21) Appl. No.: 10/382,953

(22) Filed: Mar. 5, 2003

(65) Prior Publication Data

US 2003/0154438 A1 Aug. 14, 2003

Related U.S. Application Data

(60) Division of application No. 09/896,289, filed on Jun. 28, 2001, now Pat. No. 6,834,090, which is a continuation of application No. 09/305,858, filed on May 5, 1999, now Pat. No. 6,282,250.

(51) Int. Cl.
*H03M 13/00* (2006.01)

(52) U.S. Cl. ............... 714/752; 714/786; 714/702

(58) Field of Classification Search ........... 714/755, 714/752, 702
See application file for complete search history.

(56) References Cited

U.S. PATENT DOCUMENTS

| 5,150,378 | A | 9/1992 | Mui |
| 5,835,509 | A | 11/1998 | Sako et al. |
| 5,883,923 | A | 3/1999 | Shimazaki |
| 6,038,253 | A | 3/2000 | Shimazaki |
| 6,094,465 | A | 7/2000 | Stein et al. |
| 6,177,930 | B1 | 1/2001 | Chernock et al. |

(Continued)

FOREIGN PATENT DOCUMENTS

JP 05-167566 7/1993

(Continued)

OTHER PUBLICATIONS

D.N. Rowitch and L.B. Milstein, "Rate compatible punctured turbo (RCPT) codes in a hybrid FEC/ARQ system," in Proc. Communications Theory Mini-Conf. of GLOBECOM'97 Phoenix, AZ, Nov. 1997, pp. 55-59.

*Primary Examiner*—Guy Lamarre
*Assistant Examiner*—Esaw Abraham
(74) *Attorney, Agent, or Firm*—Kyong Macek; Jonathan T. Velasco; Thomas R. Rouse

(57) ABSTRACT

A method and apparatus for decoding a frame of interleaved information bits in a communication system, where the decoding of the frame of interleaved information bits may begin before all of the bits in the frame are received. The frame of interleaved information bits has a frame start time and a frame end time. The frame also includes a first fractional segment that has a start time that is the same as the frame start time and an end time that is before the frame end time. Prior to transmission of the frame of interleaved information bits to a decoding site, all bits in the frame are encoded at a code rate R to provide encoded bits, and the encoded bits are positioned in the interleaved frame in accordance with an interleaving pattern that stores bits having a code rate R1 within a first fractional segment of the interleaved frame.

4 Claims, 4 Drawing Sheets

U.S. PATENT DOCUMENTS

| | | |
|---|---|---|
| 6,282,250 B1 | 8/2001 | Lundby |
| 6,370,669 B1 * | 4/2002 | Eroz et al. .................. 714/774 |
| 6,463,031 B1 * | 10/2002 | Tran .......................... 370/203 |
| 6,834,090 B2 | 12/2004 | Lundby |

FOREIGN PATENT DOCUMENTS

| | | |
|---|---|---|
| JP | 08-116313 | 5/1996 |
| WO | 1998-032231 | 7/1998 |

* cited by examiner

APPARATUS AND METHOD OF EARLY DECODING IN COMMUNICATION SYSTEMS

RELATED APPLICATIONS

This application is a divisional of utility application Ser. No. 09/896,289, entitled "LOW DELAY DECODING" and filed Jun. 28, 2001, now U.S. Pat. No. 6,834,090, issued Dec. 21, 2004 which is a continuation of utility application Ser. No. 09/305,858, entitled "LOW DELAY DECODING" and filed on May 5, 1999, now U.S. Pat. No. 6,282,250 issued Aug. 28, 2001, both of which are asigned to the assignee hereof.

BACKGROUND

1. Field of the Invention

This invention relates to the field of communications systems and, in particular, to transmission of message signals in a communications system.

2. Description of Related Art

It is well known that it is desirable to reduce the receive and decode delay of frames of data transmitted from a transmitter to a receiver in a communications system. For example, it is desirable to reduce frame delay when information is transmitted through a broadcast channel in a cellular system. Among other things, a reduced delay will allow mobile units to access the cellular system in a faster manner.

Some delay can be tolerated when voice telephones access a cellular system in order to initiate a call. In the case of cell handoff, if the amount of delay is relatively small then it is unnoticeable to the user. However, if the delay becomes too large, it can result in a call being dropped by the system.

High data rate terminals are an example where receive and decode delay is critical. These terminals frequently go on and off line and the access delay can slow applications and result in congestion at the data source. Additionally, in soft handoff even a short delay can produce significant congestion or loss of data.

It is known in the prior art to reduce frame size in order to reduce this delay problem. However, this solution reduces the coding gain or the amount of data that can be transmitted as well as interleaving gain. In order to partially compensate for the loss incurred using this method, the power of the channel can be increased or other methods such as the R-RAKE technique can be used. Additionally increasing the power of the channel will decrease the total capacity of the system. Moreover, the R-RAKE compensation technique requires two or more frames in a row to be the same, and the receiver must be able to know or detect this condition. It can be difficult or troublesome for a system to make this determination.

SUMMARY

The present invention is directed to a method and apparatus for decoding a frame of interleaved information bits in a communications system. The present invention permits decoding of the frame of interleaved information bits before all of the bits in the frame are received at a decoding site. In the present invention, the frame of interleaved information bits has a frame start time and a frame end time. The frame also includes a first fractional segment that has a start time that is the same as the frame start time and an end time that is before the frame end time. Prior to transmission of the frame of interleaved information bits to a decoding site, all bits in the frame are encoded at a code rate R to provide encoded bits, and the encoded bits are positioned in the interleaved frame in accordance with an interleaving pattern that stores bits having a code rate R1 within the first fractional segment of the interleaved frame. In a preferred embodiment, $R1=R/a_1$, and $a_1$, corresponds to the duration of the first fractional segment of the frame. At the decoding site, interleaved information bits from the first fractional segment of the frame are initially received, and an attempt is made to decode the frame using information bits from only the first fractional segment of the frame. If this initial decoding attempt is unsuccessful, the system attempts to decode the frame again using information bits from both the first fractional segment of the frame and further information bits located between the end time of the first fractional segment and the frame end time.

In accordance with a further aspect, the interleaving pattern described above also optionally stores bits having a code rate R2 at a second fractional segment of the interleaved frame, wherein the starting time of the interleaved frame and starting time of the second fractional segment coincide with each other, and the second fractional segment has an ending time that is after an ending time of the first fractional segment. The interleaving pattern also optionally stores bits having a code rate R3 at a third fractional segment of the interleaved frame, wherein the; starting time of the interleaved frame and starting time of the third fractional segment coincide with each other, and the third fractional segment has an ending time that is after an ending time of the second fractional segment. In a preferred embodiment, $a_2$ corresponds to a length of the second fractional segment of the frame, $a_3$ corresponds to a length of the third fractional segment of the frame, and the interleaving pattern used is chosen such that $R2=R/a_2$ and $R3=R/a_3$. Additionally, the bits in the first fractional segment are included in the second fractional segment; and the bits in the first and second fractional segments are included in the third fractional segment.

In accordance with a still further aspect, when the interleaved frame is formed as described in the paragraph above, if the initial decoding attempt (using only the first fractional segment) is unsuccessful, the system attempts to decode the frame a second time using information bits from only the second fractional segment of the frame. If this second decoding attempt fails, the system then attempts to decode the frame a third time using information bits from only the third fractional segment of the frame. Finally, if this third decoding attempt fails, the system attempts to decode the frame again using all information bits from the frame. In accordance with a particularly preferred aspect, the first, second and third decoding attempts described above may be performed before all of the frame has been received by the receiver at the decoding site.

Many values of $a_1$, $a_2$ and $a_3$ may be used for implementing the present invention. In one embodiment described below, $a_1$, $a_2$ and $a_3$ correspond to the values ¼, ½, and ¾ respectively. It will be understood by those skilled in the art that other values for these parameters may alternatively be used for implementing the invention.

BRIEF DESCRIPTION OF THE DRAWINGS

The features, objects, and advantages of the present invention will become more apparent from the detailed description set forth below when taken in conjunction with the drawings in which like reference characters identify corresponding elements throughout and wherein.

DETAILED DESCRIPTION OF THE INVENTION

Figure 1:
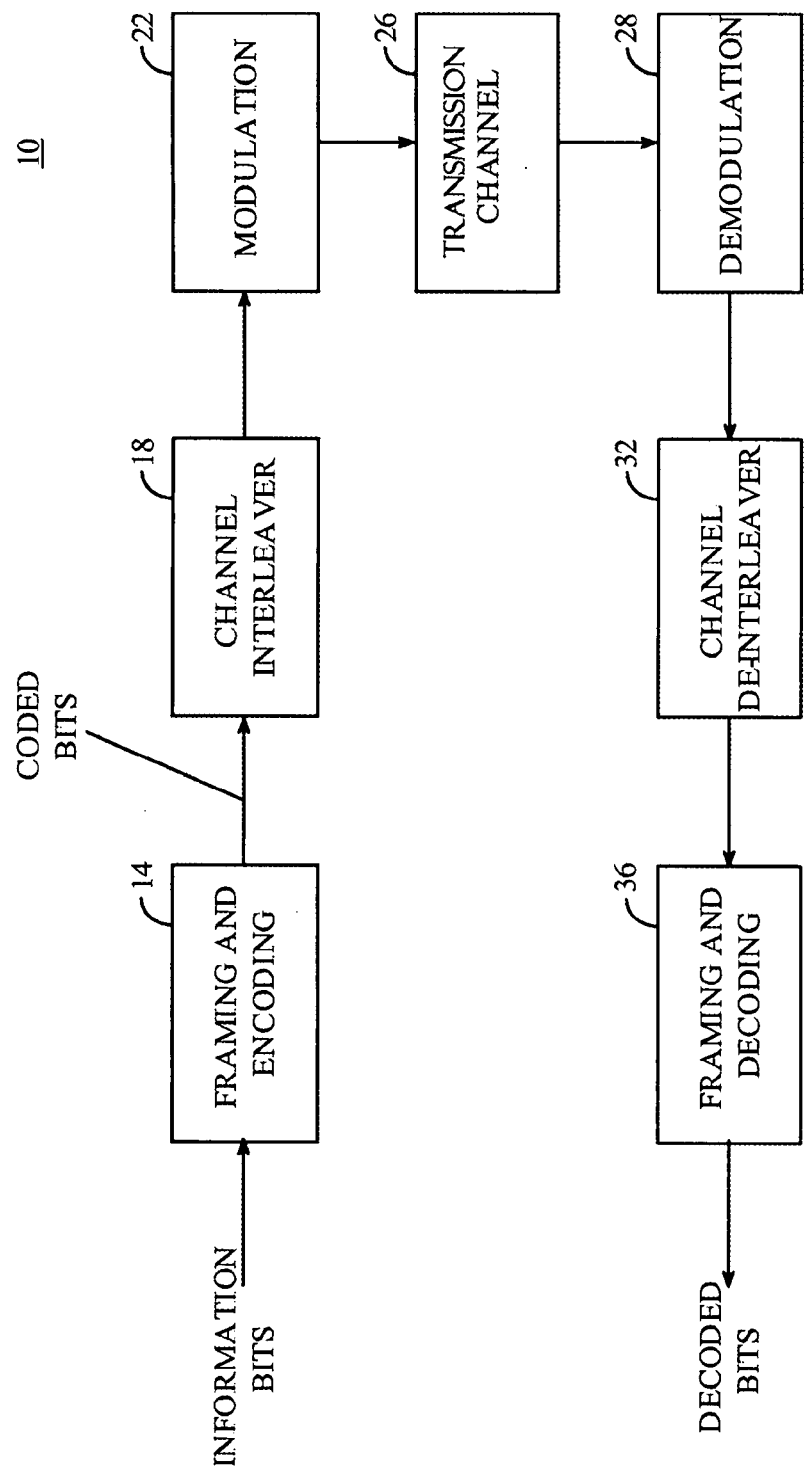
FIG. 1 shows a transmission and reception chain within a communications system.

Referring now to FIG. 1, there is shown transmission chain 10 for encoding, transmitting, and decoding data in a communications channel. Information bits within transmission chain 10 are received by framing and encoding block 14, (hereinafter "block 14"), which encodes the bits at a code rate R. As described below, the rate R is directly related to the amount of redundancy introduced into the information stream as information is transformed into coded bits by block 14. After the framing and encoding is performed in block 14, coded information bits from block 14 are applied to channel interleaver block 18 which outputs a frame of interleaved bits. As discussed more fully below, channel interleaver block 18 interleaves the coded bits using an interleaving pattern that facilitates early decoding of the frame at a decoding site. More particularly, the interleaving pattern is chosen such that the information stored in the frame may be successfully decoded using only bits in a first fractional portion of the interleaved frame. The interleaved frames output from channel interleaver block 18 are received, modulated and transmitted by modulation block 22. The modulated information is transmitted by way of transmission channel 26 to a receiving/decoding site.

Within a receiver of the communication system, the transmitted information is received and demodulated as shown in demodulation block 28. The demodulated information is deinterleaved in channel de-interleaver block 32. Decoding is then performed in framing and decoding block 36 to provide decoded information bits. As explained more fully below, framing and decoding block 36 functions by first attempting to decode the frame using only those bits in a first fractional portion of the frame. This first decoding attempt is preferably performed before all the bits in a frame are received by framing and decoding block 36. If this first decoding attempt fails, framing and decoding block 36 attempts again to decode the frame using additional bits from the received frame.

The performance of the decoding process of transmission chain 10 is related to the average energy per coded bit to interference ratio $E_s/N_0$ of the signal received by demodulation block 28. The performance of the decoding process is also related to the performance of the code used in block 14 for coding the information bits. One characteristic of the code that is important for its performance is its rate R. The rate R is directly related to the amount of redundancy introduced into the information stream when the information is transformed into coded bits within block 14. For example, a code of rate R=¼ produces four coded bits for each uncoded information bit. A lower code rate R produces a more efficient code. A more efficient code requires a lower $E_s/N_0$ for successful decoding of a frame.

In an example, the average signal-to-noise interference $E_s/N_0$ is constant throughout a frame. A code used within framing and encoding block 14 has a rate R. In the prior art, it is typically necessary to wait until an entire frame is received before deinterleaving and decoding it. However, it is easy to perform the deinterleaving as the symbols are received by the receiver. Thus, there is a delay between the time that deinterleaved bits can be available and the time when the decoding can be performed. In order to reduce the delay in accordance with the method of the present invention, decoding of the frame can be attempted before the reception of the frame is complete.

If channel interleaver 18 of transmission chain 10 is designed as set forth below, the decoding of the frame before the reception is complete can be performed by using only those coded bits in a first fractional portion of the frame. For example, if the code rate R of the encoding process is ¼, the decoding can begin when only half of the frame is received. If channel interleaver 18 is appropriately chosen as described below, the coded bits received in the first fractional portion of the frame appear as information bits encoded with R=¼*2=½ rate code. $E_s/N_0$ for the received bits is the same as if the entire frame had been received. If the code is well designed, the performance loss is therefore only the performance loss due to converting the original information bits to a higher rate code, plus half the power (3dB) because only half the frame is received.

Figure 2:
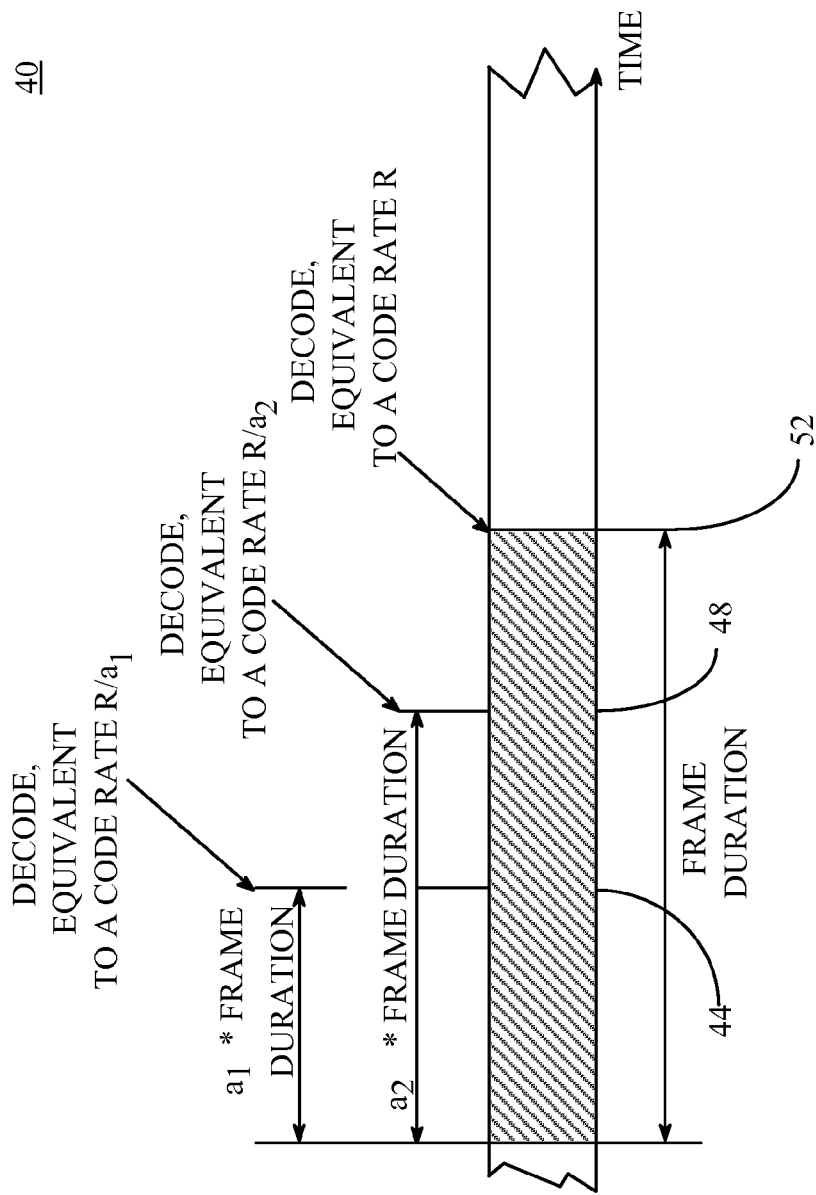
FIG. 2 shows the method for performing early decoding of a received information frame in accordance with the method of the present invention.

Referring now to FIG. 2, there is shown a graphical representation of early decoding method 40 of the present invention. Early decoding process 40 is preferably implemented on decoding block 36. In accordance with early decoding process 40, it is possible to begin decoding a frame before is entirely received and wait until additional bits are received. The decoding process can be attempted again once more bits have been received if the previous decoding attempt failed. The repeating of the decoding process can continue until either a successful decoding of the frame or reception of the entire frame.

In early decoding method 40, a first attempt at decoding the received frame is performed at time 44 using only those bits in the first fractional portion of the frame (i.e., the first ($a_1$*100) % of the frame.) Assuming that the received frame was previously coded and interleaved as described below, then at time 44 the code rate of the received bits is R/$a_1$, where $a_1$ represents the time between the beginning of the frame and time 44 divided by time 52 (where time 52 is the total duration of the frame.) If the decoding performed at time 44 is not successful, another decoding of the frame can be attempted at time 48 using only those bits in the second fractional portion of the frame (i.e., the first ($a_2$*100) % of the frame.) Assuming again that the received frame was previously coded and interleaved as described below and that the time between the beginning of the frame and time 48 is $a_2$, the rate of the decoded bits provided at time 48 is R/$a_2$, where $a_2$ represents the time between the beginning of the frame and time 48 divided by time 52. If the decoding performed at time 48 is not successful, the process can then be repeated again using a third fractional portion of the received frame (i.e., the first ($a_3$*100) % of the frame.) Assuming that the received frame was previously coded and interleaved as described below, then at the time of this third decoding the code rate of the received bits is R/$a_3$, where $a_3$ represents the time between the beginning of the frame and the end of the third fractional portion divided by time 52. Finally, if this third decoding attempt is unsuccessful, the frame may be decoded in a fourth attempt using all of the bits in the received frame. In the preferred embodiment, the first three decoding attempts described above may be performed before all the bits in the frame are received by framing and decoding block 36. More particularly, the first decoding attempt may be performed as soon as the bits in the first fractional portion of the frame are received by framing and decoding block 36, the second decoding attempt may be performed as soon as the bits in the second fractional portion of the frame are received by decoding block 36, and the third decoding attempt may be performed as soon as the bits in the third fractional portion of the frame are received by framing and decoding block 36.

Figure 3A:
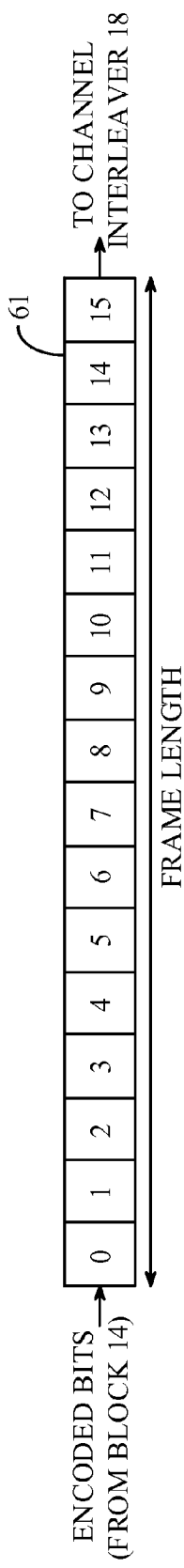
FIGS. 3A, 3B show an exemplary interleaving pattern used for interleaving frames of encoded bits in accordance with the present invention.
Figure 3B:
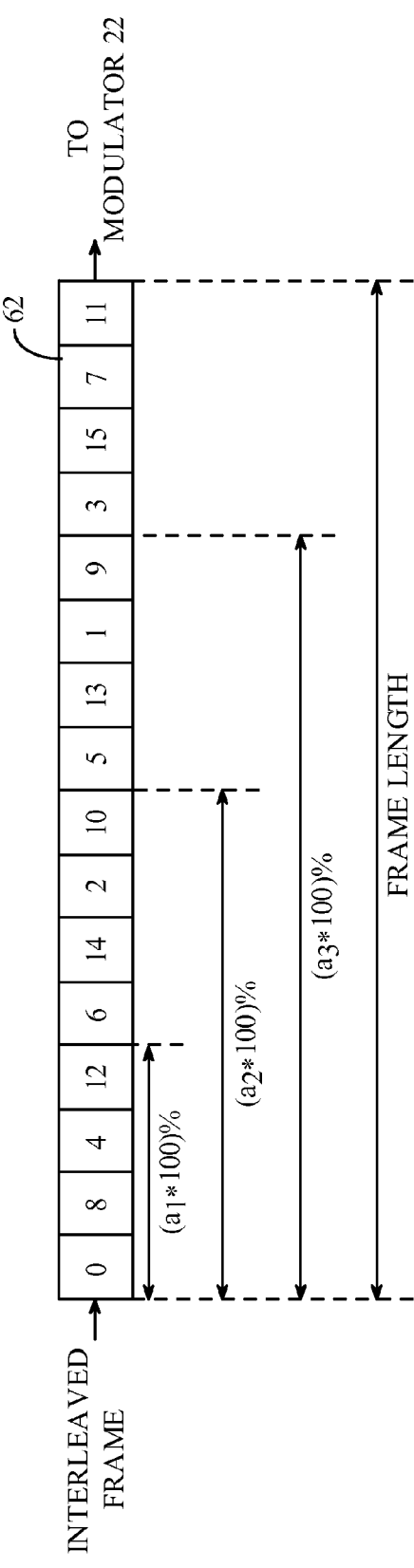

Referring now to FIGS. 3A, 3B, there is shown an exemplary interleaving pattern used for interleaving frames of encoded bits in accordance with one embodiment of the present invention. FIGS. 3A and 3B represent an exemplary frame 61 of coded bits output from encoding block 14. In the example shown, the frame is 16 bits in length, the bits are numbered 0–15, and the code used for coding the bits in frame 61 has rate R. Each frame of coded bits from block 14 is then applied to channel interleaver 18, which interleaves the bits in accordance with an interleaving pattern that facilitates early decoding of each received frame at a decoding site as described above. An exemplary interleaving pattern that facilitates such early decoding is shown in connection with FIG. 3B, which illustrates an exemplary interleaved frame 62 output by block 18. In the example shown, the first fractional portion ($a_1$*100%) of the interleaved frame corresponds to the first ¼ of the interleaved frame 62 and includes bits coded at the code rate R1, where $R1=R/a_1$; the second fractional portion ($a_2$*100%) of the interleaved frame corresponds to the first ½ of the interleaved frame 62 and includes bits coded at the code rate R2, where $R2=R/a_2$; and the third fractional portion ($a_3$*100%) of the interleaved frame corresponds to the first ¾ of the interleaved frame 62 and includes bits coded at the code rate R3, where $R3=R/a_3$. This interleaving pattern may be used in connection with an early decoding process that permits decoding attempts when ¼, ½, and ¾, respectively, of the frame is received by framing and decoding block 36. It will be understood by those skilled in the art that other values of $a_1$, $a_2$ and $a_3$ may be used for implementing the present invention, and that each frame may be interleaved using only one or two or more than three of the fractional portions described above. It will also be understood by those skilled in the art that other interleaving patterns besides that shown in FIG. 3B may be used for implementing the early decoding process of the present invention, and that the use of such of interleaving patterns is within the scope of the present invention.

Figure 4:
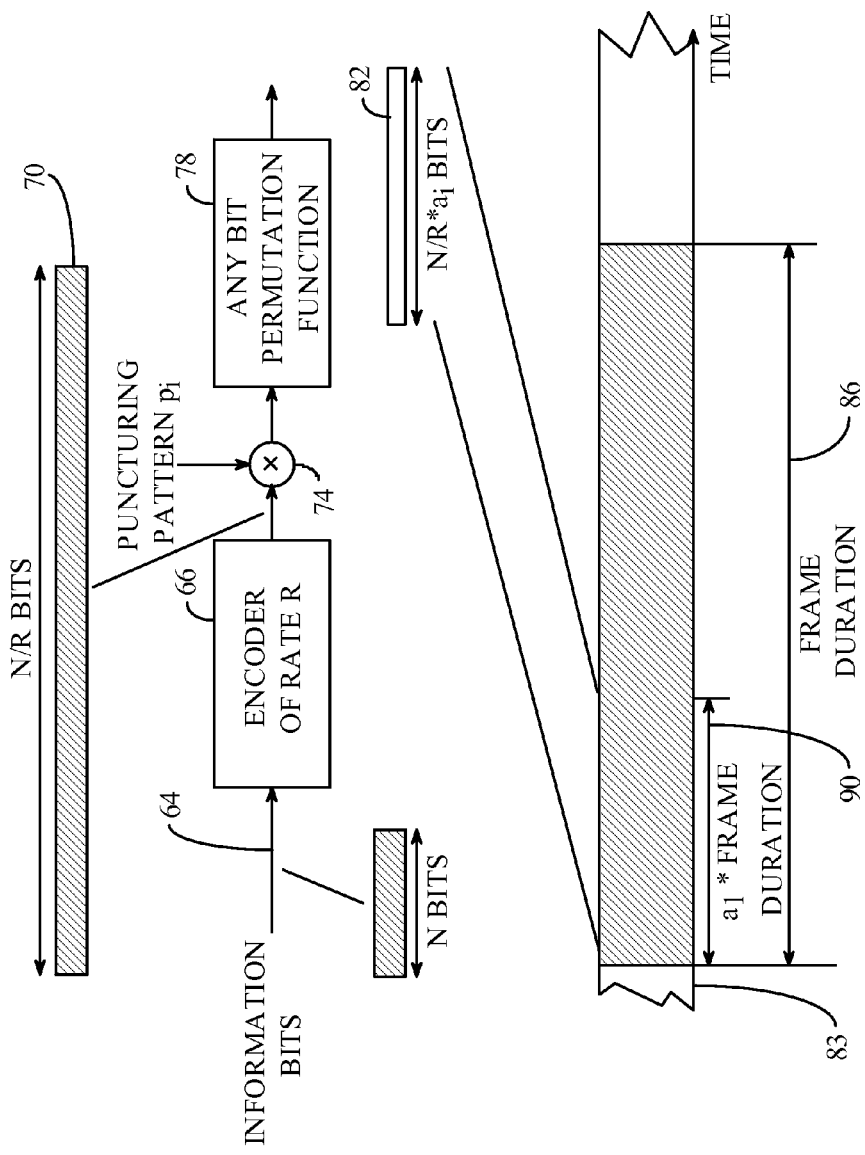
FIG. 4 shows a further method for forming an interleaved frame of coded bits for use in a communications system such as the system of FIG. 1, in accordance with an alternative embodiment of the present invention.

Referring now to FIG. 4, there is shown a further method for forming an interleaved frame of coded bits, in accordance with an alternative embodiment of the present invention. In the method shown in FIG. 4, each frame of N information bits is applied to an encoder 66 that codes the input bits using a code rate R. For each frame of N information bits applied to encoder 66, the encoder outputs a frame having N/R coded bits. Puncturing patterns $p_i$ are then applied to each frame of coded information bits at block 74. A code of rate $R/a_i$ is thereby produced for each puncturing pattern $p_i$. The values of $a_i$ correspond to all of the possible fractions of the information frame at which detection is attempted within early decoding method 40. For, example, $a_1$=¼, $a_2$=½, $a_3$=¾ can be used. This corresponds to attempting is to decode when ¼, ½, and ¾, respectively, of the frame is received. This selection can be performed using brute force techniques. For example, the values ¼, ½, and ¾ can be tried and the results determined. Other values can then be tried and the results determined. Each puncturing pattern $p_i$ is chosen so that the punctured coded bits contain the coded bits obtained using puncturing pattern $p_j$ if j<i. Thus, the bits produced by puncturing with the first pattern must be included in bits produced by subsequent (larger) patterns.

Channel interleaver 18 can then be selected in view of the puncturing patterns $p_i$ as follows. Information bits 64 are applied to encoder 66, Information bits 64 have a length N. Encoder 66 has a rate R. Encoded bit stream 70 having a length N/R is thus provided at the output of encoder 66. Puncturing device 74 receives encoded bit stream 70 and applies a puncturing pattern $p_i$ to it. The output of puncturing device 74 is applied to permutation function 78. Permutation function 78 can be any permutation function that provides N/R* $a_i$ output bits 82 as shown within interleaver selection method 60.

Output bits 82 are inserted by channel interleaver 18 within first fraction 90 of frame duration 86. First fraction 90 has a length $a_1$*100% the length of frame duration 86. If repeated attempts are made to decode the frame, N/R* $a_2$ output bits 82 and N/R* $a_3$ output bits 82 from permutation function 78 must be inserted into the appropriate fractions of frame duration 86 by channel interleaver 18. The inserted output bits 82 have lengths of $a_2$*100 percent and $a_3$*100, respectively, of the length of frame duration 86 and have a starting time that coincides with frame duration 86.

The previous description of the preferred embodiments is provided to enable a person skilled in the art to make and use the present invention. The various modifications to these embodiments will be readily apparent to those skilled in the art, and the generic principles defined herein can be applied to other embodiments without the use of the inventive faculty. Thus, the present invention is not intended to be limited to the embodiments shown herein but is to be accorded the widest scope consistent with the principles and novel features disclosed.

What is claimed:

1. A method of interleaving encoded bits into an interleaving pattern for a frame such that the interleaving pattern facilitates early decoding of the frame at a decoding site, comprising:

interleaving encoded bits into at least a first fractional segment of the frame, a second fractional segment of the frame, and a third fractional segment of the frame, wherein the first fractional segment is characterized by a code rate R1, the second fractional segment is characterized by a code rate R2, and the third fractional segment is characterized by a code rate R3 such that the code rate R1 is greater than the code rate R2, the code rate R2 is greater than the code rate R3, and the code rate R3 is greater than a frame code rate R, wherein $R1=R/a_1$, $a_1$ corresponds to the duration of the first fractional segment, and the interleaved pattern of the frame has a starting time that coincides with a starting time of the first fractional segment, wherein $R2=R/a_2$, $a_2$ corresponds to the duration of the second fractional segment, the starting time of the interleaved pattern of the frame coincides with a starting time of the second fractional segment, and the second fractional segment has an ending time that is after an ending time of the first fractional segment, wherein $R3=R/a_3$, $a_3$ corresponds to the duration of the third fractional segment, the starting time of the interleaved pattern of the frame coincides with a starting time of the third fractional segment, and the third fractional segment has an ending time that is after the ending time of the second fractional segment, and wherein the bits in the first fractional segment are included in the second fractional segment, and the bits in the first and second fractional segments are included in the third fractional segment.

2. A subsystem for reducing frame delay in a communications system, comprising:

an interleaver at a transmitter for interleaving a plurality of encoded bits into a frame by using a first interleaving pattern that has a code rate R1 over a first fractional segment of the frame, a second interleaving pattern that has a code rate R2 over a second fractional segment of the frame, wherein the code rate R1 is greater than the code rate R2, and the code rate R2 is greater than a code rate R for the frame; and a decoder at a receiver for decoding the first fractional segment of the frame before the frame is completely received, wherein $R1=R/a_1$, $a_1$ corresponds to the duration of the first fractional segment, and the interleaved pattern of the frame has a starting time that coincides with a starting time of the first fractional segment, wherein $R2=R/a_2$, $a_2$ corresponds to the duration of the second fractional segment, the starting time of the interleaved pattern of the frame coincides with a starting time of the second fractional segment, and the second fractional segment has an ending time that is after an ending time of the first fractional segment, and wherein the bits in the first fractional segment are included in the second fractional segment.

3. The subsystem of claim 2, wherein the decoder is for decoding the second fractional segment of the frame before the frame is completely received.

4. An apparatus, comprising:

a channel interleaver configured to interleave encoded bits into an interleaving pattern for a frame such that the interleaving pattern facilitates early decoding of the frame at a decoding site, wherein the interleaving pattern interleaves encoded bits into at least a first fractional segment of the frame, a second fractional segment of the frame, and a third fractional segment of the frame, such that the first fractional segment is characterized by a code rate R1, the second fractional segment is characterized by a code rate R2, and the third fractional segment is characterized by a code rate R3 and further, the code rate R1 is greater than the code rate R2, the code rate R2 is greater than the code rate R3, and the code rate R3 is greater than a frame code rate R, wherein $R1=R/a_1$, $a_1$ corresponds to the duration of the first fractional segment, and the interleaved pattern of the frame has a starting time that coincides with a starting time of the first fractional segment, wherein $R2=R/a_2$, $a_2$ corresponds to the duration of the second fractional segment, the starting time of the interleaved pattern of the frame coincides with a starting time of the second fractional segment, and the second fractional segment has an ending time that is after an ending time of the first fractional segment, wherein $R3=R/a_3$, $a_3$ corresponds to the duration of the third fractional segment, the starting time of the interleaved pattern of the frame coincides with a starting time of the third fractional segment, and the third fractional segment has an ending time that is after the ending time of the second fractional segment, and wherein the bits in the first fractional segment are included in the second fractional segment, and the bits in the first and second fractional segments are included in the third fractional segment.

\* \* \* \* \*